US009218972B1

(12) United States Patent
Horiguchi

(10) Patent No.: US 9,218,972 B1
(45) Date of Patent: Dec. 22, 2015

(54) PATTERN FORMING METHOD FOR MANUFACTURING SEMICONDUCTOR DEVICE

(71) Applicant: Kabushiki Kaisha Toshiba, Minato-ku (JP)

(72) Inventor: Kazunori Horiguchi, Nagoya (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/479,570

(22) Filed: Sep. 8, 2014

Related U.S. Application Data

(60) Provisional application No. 62/021,253, filed on Jul. 7, 2014.

(51) Int. Cl.
*H01L 21/8242* (2006.01)
*H01L 21/033* (2006.01)
*H01L 21/311* (2006.01)

(52) U.S. Cl.
CPC ...... *H01L 21/0338* (2013.01); *H01L 21/31144* (2013.01)

(58) Field of Classification Search
CPC .......................... H01L 27/10852; H01L 28/91
USPC ...................................................... 438/253
See application file for complete search history.

(56) References Cited

U.S. PATENT DOCUMENTS

| 6,159,788 A * | 12/2000 | Jenq et al. ............... 438/253 |
| 6,274,471 B1 * | 8/2001 | Huang .................. 438/597 |
| 7,029,970 B2 * | 4/2006 | Ahn ...................... 438/239 |
| 7,767,582 B2 | 8/2010 | Nishiyama et al. |
| 2003/0235987 A1 * | 12/2003 | Doshita .................. 438/689 |
| 2005/0037605 A1 * | 2/2005 | Kim et al. ............... 438/622 |
| 2006/0205146 A1 * | 9/2006 | McDaniel ............... 438/253 |
| 2006/0211186 A1 * | 9/2006 | Chun et al. ............. 438/197 |
| 2008/0076191 A1 * | 3/2008 | Hall et al. .................. 438/3 |
| 2012/0161207 A1 * | 6/2012 | Homyk et al. ........... 257/253 |
| 2013/0241015 A1 * | 9/2013 | Nomachi ................ 257/421 |
| 2014/0363964 A1 * | 12/2014 | Breil et al. ............. 438/595 |
| 2015/0069488 A1 * | 3/2015 | Matsumori et al. ...... 257/315 |

FOREIGN PATENT DOCUMENTS

| JP | 7-66157 | | 3/1995 |
| JP | 2001274097 A | * | 10/2001 |
| JP | 2007-109718 | | 4/2007 |
| JP | 3954606 | | 8/2007 |
| KR | 100654002 B1 | * | 6/2006 |

* cited by examiner

*Primary Examiner* — Eva Y Montalvo
*Assistant Examiner* — Mohammad M Hoque
(74) *Attorney, Agent, or Firm* — Oblon, McClelland, Maier & Neustadt, L.L.P.

(57) ABSTRACT

In a manufacturing method of a semiconductor device according to an embodiment, a processing target film is formed above a substrate. A buffer layer in a polycrystalline state or an amorphous state is formed on the processing target film. A mask material is formed on the buffer layer. The processing target film is etched using the mask material as a mask. The buffer layer has an etching rate smaller than the processing target film.

9 Claims, 5 Drawing Sheets

PATTERN FORMING METHOD FOR MANUFACTURING SEMICONDUCTOR DEVICE

CROSS REFERENCE TO RELATED APPLICATIONS

This application is based upon and claims the benefit of priority from the prior U.S. Provisional Patent Application No. 62/021,253, filed on Jul. 7, 2014, the entire contents of which are incorporated herein by reference.

FIELD

The embodiments of the present invention relate to a manufacturing method of a semiconductor device.

BACKGROUND

In recent years, a three-dimensional memory using a three-dimensional cell stacking technology has been developed. The three-dimensional memory includes a stack layer structure having control electrodes of memory cells and insulating films alternately stacked, and silicon pillars that pass through the stack layer structure. The silicon pillars are formed in memory holes passing through the stack layer structure to reach a back gate.

Because many control electrodes and many insulating films are stacked in the three-dimensional memory, an aspect ratio of the memory holes is quite high. Therefore, a material having a high etching resistance is used as a hard mask to be used for forming the memory holes.

However, when the hard mask has a grain boundary in the film thickness direction, etching gas reaches a processing target material located below the hard mask in a formation step of the memory holes. In this case, the processing target material is etched and thus the hard mask is peeled from the processing target material.

DETAILED DESCRIPTION

Embodiments will now be explained with reference to the accompanying drawings. The present invention is not limited to the embodiments. In the embodiments, "an upper direction" or "a lower direction" refers to a relative direction when a direction of a surface of a semiconductor substrate on which semiconductor elements are provided is assumed as "an upper direction". Therefore, the term "upper direction" or "lower direction" occasionally differs from an upper direction or a lower direction based on a gravitational acceleration direction.

In a manufacturing method of a semiconductor device according to an embodiment, a processing target film is formed above a substrate. A buffer layer in a polycrystalline state or an amorphous state is formed on the processing target film. A mask material is formed on the buffer layer. The processing target film is etched using the mask material as a mask. The buffer layer has an etching rate smaller than the processing target film.

FIGS. 1 to 6 are cross-sectional views showing an example of a manufacturing method of a semiconductor device according to an embodiment. The present embodiment is applied to a formation step of memory holes in a three-dimensional memory. However, the present embodiment is applicable to a lithography technique and an etching technique in any other structures and steps.

A peripheral circuit and the like (not shown) are first formed on a substrate 10. An insulating film is then formed on the peripheral circuit and a back gate (not shown) is formed on the insulating film. A desired number of insulating films and a desired number of conducting films are then stacked thereon. The conducting films function as control gates or select gates. A conducting material such as doped polysilicon or doped amorphous silicon is used for the conducting films. The insulating films are provided to insulate and isolate between the control gates. An oxide film such as a TEOS (Tetra Ethyl Ortho Silicate) film is used as the insulating films. A stack layer structure including the insulating films and the conducting films later becomes control electrodes or select gate electrodes of a memory cell array.

Figure 1:
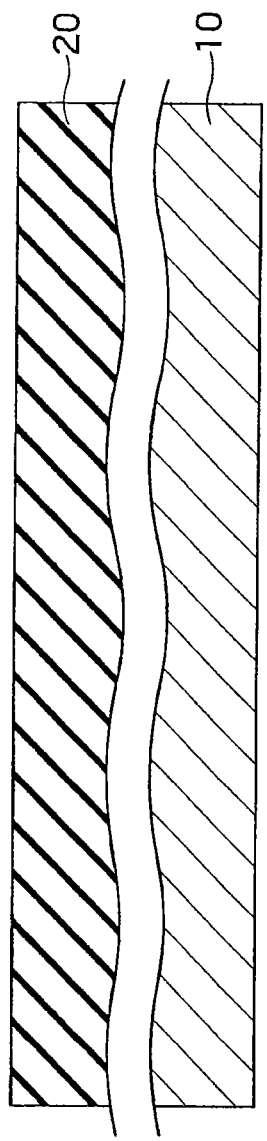
FIGS. 1 to 6 are cross-sectional views showing an example of a manufacturing method of a semiconductor device according to an embodiment.
Figure 6:
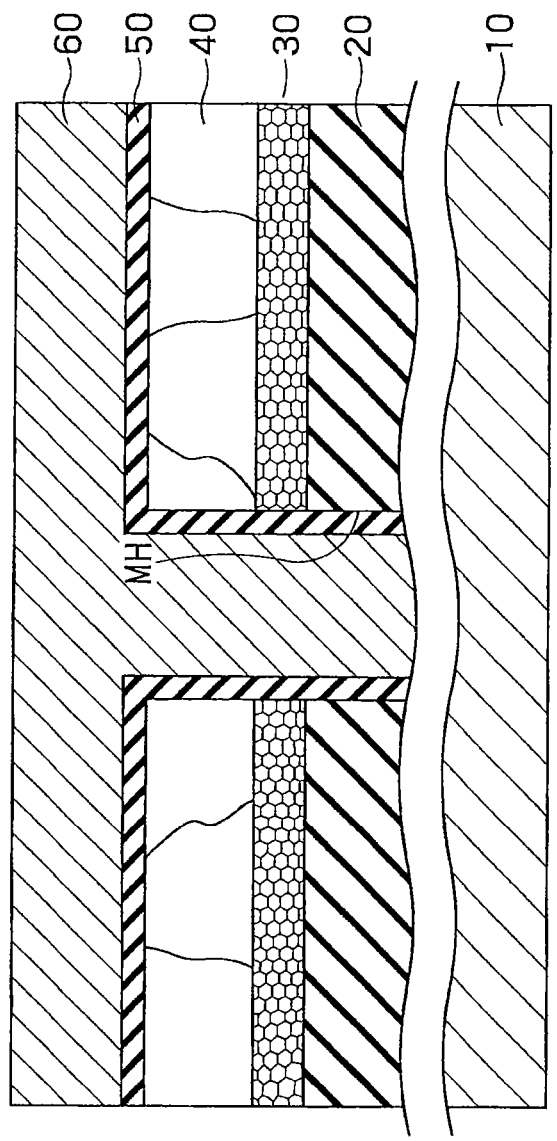

Reference numeral 20 in FIG. 1 denotes an insulating film in the uppermost layer of the stack layer structure including the insulating films and the conducting films. Other layers in the stack layer structure than the insulating film 20 in the uppermost layer are not shown in FIG. 1. The insulating film 20 is a processing target film and is selectively etched when memory holes MH shown in FIG. 6 are later formed.

Figure 2:
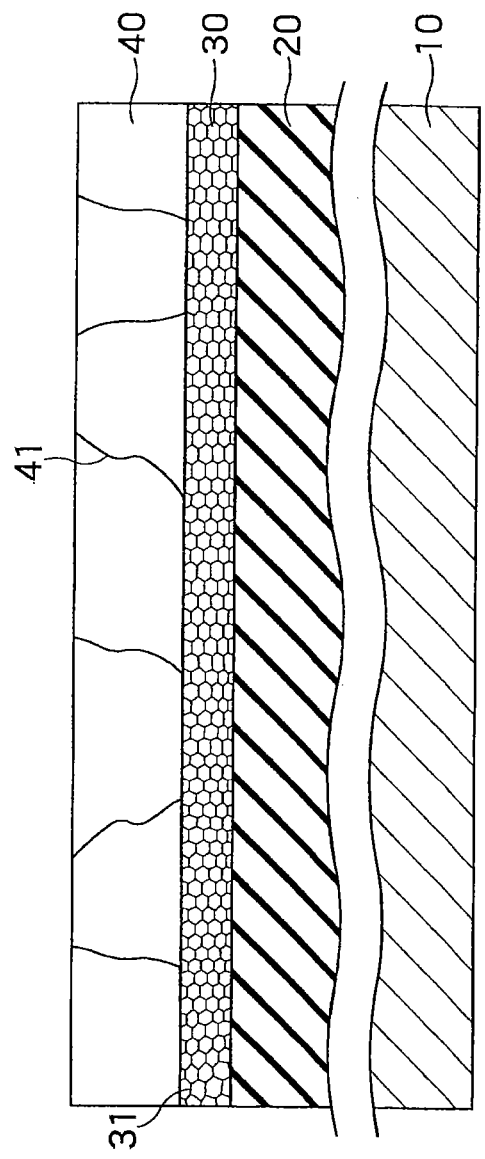

A buffer layer 30 is then formed on the insulating film 20 and a material of a hard mask 40 is formed on the buffer layer 30 as shown in FIG. 2. The buffer layer 30 is provided between the insulating film 20 and the hard mask 40 to prevent etching gas from reaching the insulating film 20 located below the hard mask 40 when the memory holes MH are formed. The buffer layer 30 is a material in a polycrystalline state or an amorphous state and is formed of a material such as a tungsten nitride, a tungsten silicide (WSi), or an aluminum oxide (AlO). Because the buffer layer 30 functions as a buffer at the time of memory hole formation, the buffer layer 30 is preferably a material having a smaller etching rate than the insulating film 20. The hard mask 40 is also a material of a smaller etching rate than the insulating film 20. The hard mask 40 is formed of a material such as tungsten, aluminum (Al), titanium (Ti), or tantalum (Ta).

A grain boundary 41 of the hard mask 40 is formed in a film thickness direction of the hard mask 40 and passes through the hard mask 40 from the front face to the rear face. For example, even if the hard mask 40 is a material having an etching resistance, such as tungsten, the grain boundary 41 of the hard mask 40 can be formed to pass through the hard mask 40 in the film thickness direction of the hard mask 40 when the grain size of crystals in the hard mask 40 is large.

On the other hand, the buffer layer 30 is in the polycrystalline state, in which the grain size of crystals is small, or in the amorphous state. Accordingly, a grain boundary 31 of the buffer layer 30 from the front face to the rear face is quite long, in the case that the buffer layer 30 is in the polycrystalline state. The grain boundary 31 itself is possibly lost, in the case that the buffer layer 30 is in the amorphous state. For example, when the buffer layer 30 is a polycrystalline film including crystals of a small grain size, the grain boundary 31 of the buffer layer 30 from the front face to the rear face is quite long. The grain boundary 31 of the buffer layer 30 does not possibly pass through the buffer layer 30 from the front face to the rear face. For example, when the buffer layer 30 is in the amorphous state, the buffer layer 30 does not have the grain boundary 31. Therefore, there is no path extending through the buffer layer 30 from the front face to the rear face.

Figure 3:
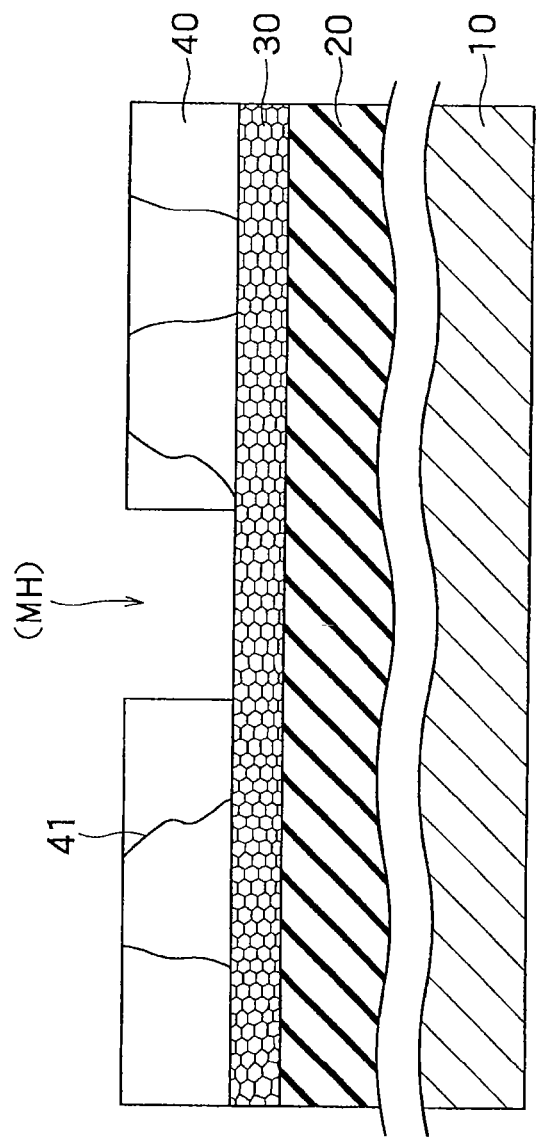

A material of the hard mask 40 is then processed using a lithography technique and a RIE (Reactive Ion Etching) method as shown in FIG. 3. While being formed of a material having a high etching resistance, such as tungsten, the hard mask 40 can be processed by the RIE method because the film thickness is small. After being processed, the hard mask 40 opens formation areas (MH) of memory holes in a surface area of the buffer layer 30 and covers the remaining area.

A stack layer structure of control electrodes including the buffer layer 30 and the insulating film 20 is then dry-etched by the RIE method using the hard mask 40 as a mask. For example, CF-based gas is used as etching gas.

The grain boundary 41 of the hard mask 40 passes through the hard mask 40 in the thickness direction. Therefore, the etching gas reaches from the front face of the hard mask 40 to the rear face thereof through the grain boundary 41 of the hard mask 40.

If the buffer layer 30 is not provided, the etching gas reaches the insulating film 20 to be covered by the hard mask 40 and etches the insulating film 20. That is, the insulating film 20 to be masked by the hard mask 40 is adversely etched. This causes the hard mask 40 to be peeled from the insulating film 20.

On the other hand, according to the present embodiment, the buffer layer 30 is provided between the hard mask 40 and the insulating film 20. The buffer layer 30 is in the polycrystalline state or the amorphous state and is smaller in the etching rate (higher in the etching resistance) than the insulating film 20. Therefore, while the etching gas having passed through the grain boundary 41 of the hard mask 40 reaches the buffer layer 30, the etching gas cannot pass through the buffer layer 30 and hardly etches the buffer layer 30. Accordingly, the etching gas does not reach the insulating film 20 located below the hard mask 40 and does not react with the insulating film 20. As a result, the hard mask 40 is not peeled from the buffer layer 30 and the insulating film 20 and can surely cover the insulating film 20. Areas of the insulating film 20 in which the memory holes MH are to be formed are of course selectively etched by the etching gas as explained later.

Figure 4:
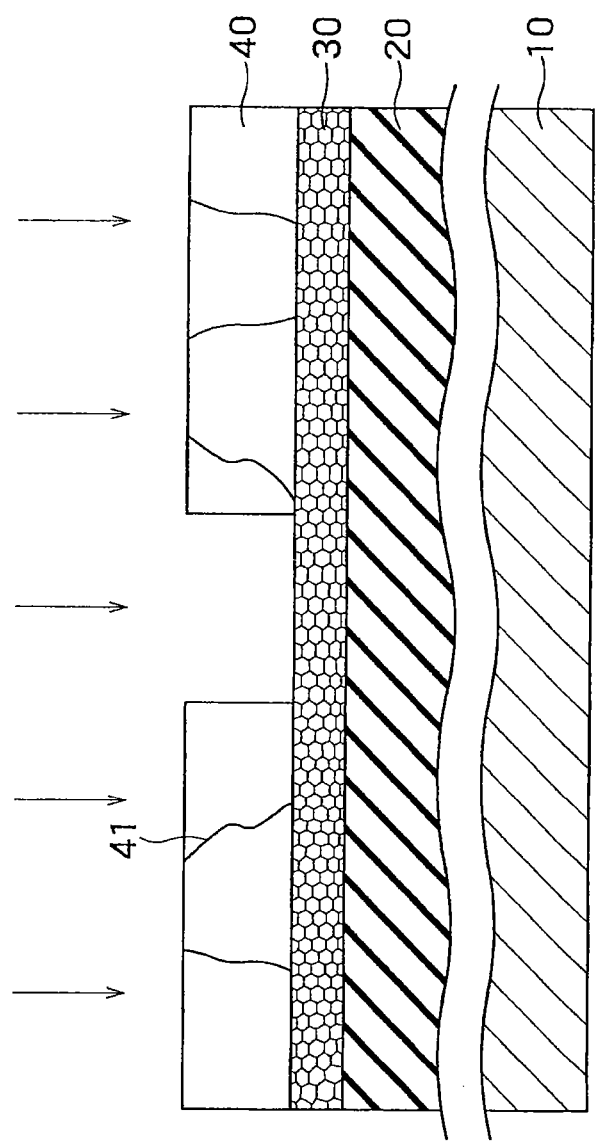
Figure 5:
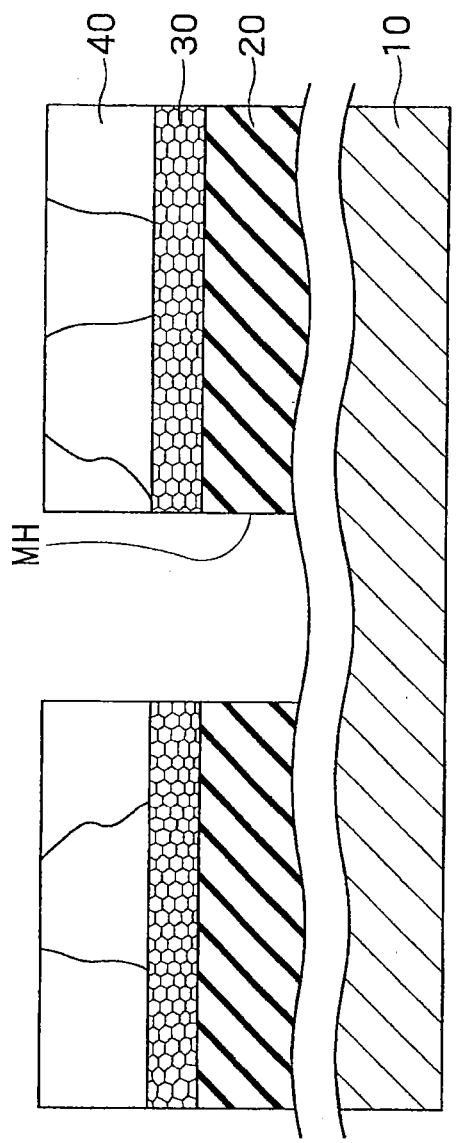

Etching is performed using the hard mask 40 as a mask as shown in FIG. 4, whereby the memory holes MH are formed as shown in FIG. 5. At this time, the hard mask 40 and the buffer layer 30 are not peeled from the insulating film 20.

Thereafter, as shown in FIG. 6, a charge accumulation layer 50 is formed on inner surfaces of the memory holes MH and then silicon pillars 60 are formed in the memory holes HM, respectively. The charge accumulation layer 50 can be a stack insulating film such as an ONO film or a NONON film (N denotes a silicon nitride film and O denotes a silicon dioxide film). A material of the silicon pillars 60 can be a conductive material such as doped polysilicon or doped amorphous silicon.

The hard mask 40 and the buffer layer 30 are then removed using a CMP (Chemical Mechanical Polishing) method. Gate electrodes of select gates, interlayer dielectric films, contact plugs, wires, and the like (not shown) are further formed, whereby a three-dimensional memory is completed.

As described above, according to the present embodiment, the buffer layer 30 is interposed between the hard mask 40 and the insulating film 20 when the insulating film 20 as the processing target film is etched. The buffer layer 30 is in the polycrystalline state or the amorphous state and is smaller in the etching rate (higher in the etching resistance) than the insulating film 20. Therefore, even when the etching gas passes through the grain boundary 41 of the hard mask 40, the buffer layer 30 blocks the etching gas. Accordingly, the etching gas does not reach the insulating film 20 located below the hard mask 40. As a result, the hard mask 40 and the buffer layer 30 are not peeled from the insulating film 20 during etching and thus can surely cover the insulating film 20.

An example in which the present embodiment is applied to a three-dimensional memory has been explained above. However, the present embodiment is applicable to an arbitrary structure formed by the lithography technique and the etching technique and to an arbitrary step using the lithography technique and the etching technique. Therefore, the processing target film is not limited to the insulating film 20 and can be a substrate, a wire, or a part of a device.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A manufacturing method of a semiconductor device, the method comprising:
forming a first film above a substrate;
forming a buffer layer in a polycrystalline state or an amorphous state on the first film;
forming a mask material on the buffer layer; and
etching the first film using the mask material as a mask, wherein
a grain size of crystals of the mask material is larger than a grain size of crystals of the buffer layer, and
the grain of the mask material is formed through the mask material from a front face to a rear face of the mask material.

2. The method of claim 1, wherein
the mask material has a grain boundary in a film thickness direction of the mask material, and
the buffer layer suppresses etching gas passing through the grain boundary of the mask material from reaching the first film.

3. The method of claim 1, wherein the first film is a silicon dioxide film.

4. The method of claim 2, wherein the first film is a silicon dioxide film.

5. The method of claim 1, wherein the mask material is formed of any of tungsten, aluminum, titanium, and tantalum.

6. The method of claim 2, wherein the mask material is formed of any of tungsten, aluminum, titanium, and tantalum.

7. The method of claim 1, wherein the buffer layer is formed of any of a tungsten nitride, a tungsten silicide, and an aluminum oxide.

8. The method of claim 2, wherein the buffer layer is formed of any of a tungsten nitride, a tungsten silicide, and an aluminum oxide.

9. The method of claim 1, wherein a grain thickness of the crystals of the mask material is substantially equal to the film thickness of the mask material.

* * * * *